United States Patent [19]

Leibovich et al.

[11] Patent Number: 4,723,086
[45] Date of Patent: Feb. 2, 1988

[54] COARSE AND FINE MOTION POSITIONING MECHANISM

[75] Inventors: Vladimir E. Leibovich; W. Thomas Novak, both of San Jose, Calif.

[73] Assignee: Micronix Corporation, Los Gatos, Calif.

[21] Appl. No.: 916,129

[22] Filed: Oct. 7, 1986

[51] Int. Cl.[4] .............................................. H01L 41/08
[52] U.S. Cl. ...................................... 310/328; 269/21
[58] Field of Search ...................... 310/317, 328; 269/2, 269/21; 378/34, 35, 205; 250/491.1, 491.2; 74/479

[56] References Cited

U.S. PATENT DOCUMENTS

| | | | |
|---|---|---|---|
| 2,325,238 | 7/1943 | Flint | 310/332 X |
| 2,363,409 | 11/1944 | Gibson | 310/328 X |
| 3,524,196 | 8/1970 | Church et al. | 310/328 |
| 3,569,718 | 3/1971 | Borner | 310/328 X |
| 3,611,577 | 10/1971 | Smith | 310/328 X |
| 4,195,243 | 3/1980 | Thaxter | 310/328 X |
| 4,583,135 | 4/1986 | Kimura | 310/328 X |
| 4,607,166 | 8/1986 | Tamaki | 310/328 X |

Primary Examiner—Mark O. Budd
Attorney, Agent, or Firm—Thomas S. MacDonald; Alan H. MacPherson; Paul J. Winters

[57] ABSTRACT

The positioning system, particularly useful for moving a stage mounting a semiconductor wafer for the manufacture of semiconductor devices, provides a lead screw and zero backlash nut for coarse motion of the stage. A thrust member fixedly mounts the nut and the member is flexurally mounted to a housing supporting the stage acting through a piezoelectric motor connection. This action brings the stage in a coarse adjustment mode into the capture range of the piezoelectric motor for fine adjustment by in and out movement of a pusher rod extending from the motor. Flexures allow motion of the thrust member parallel to the lead screw and protects the piezoelectric motor from undesirable side loads. A separate duplicate mechanism is used for each of x-axis and y-axis movements of the housing and stage to bring the stage to a precise position by the respective coarse and fine translationary movements of the lead screw, thrust members and piezoelectric motors.

10 Claims, 7 Drawing Figures

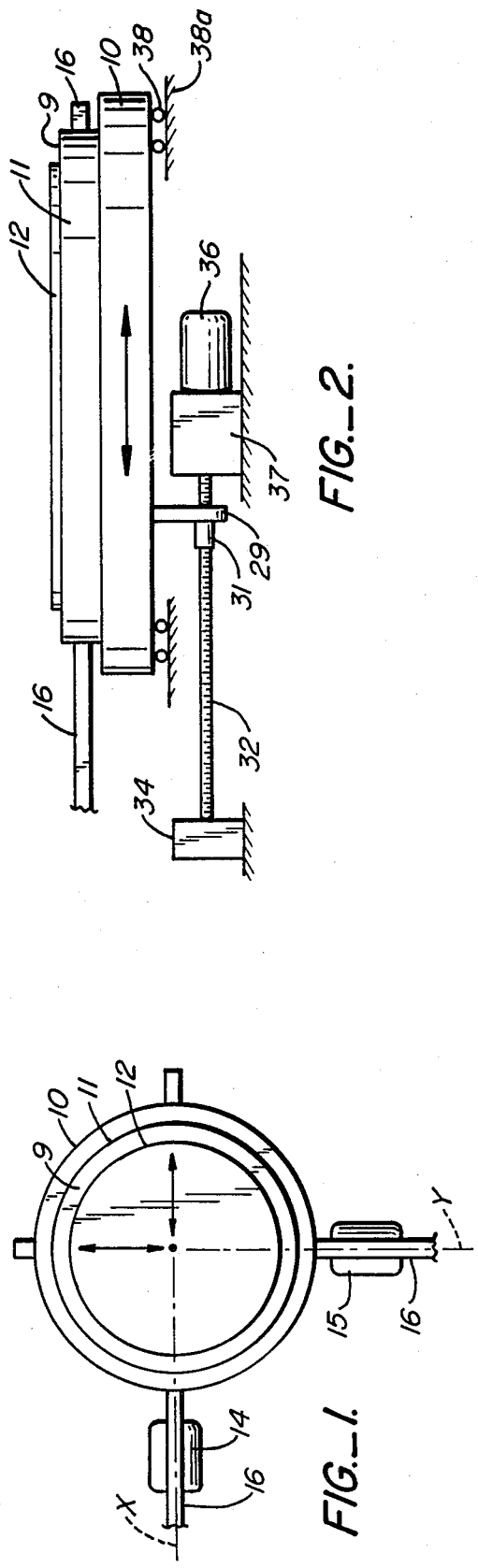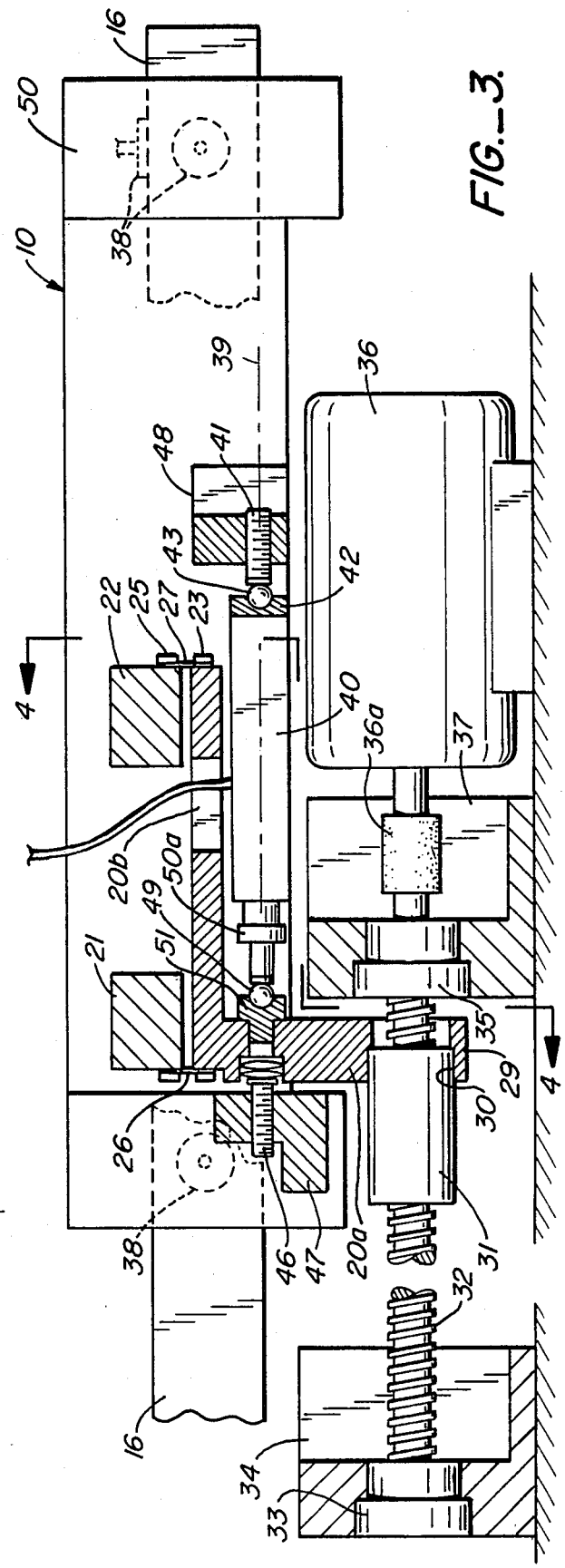

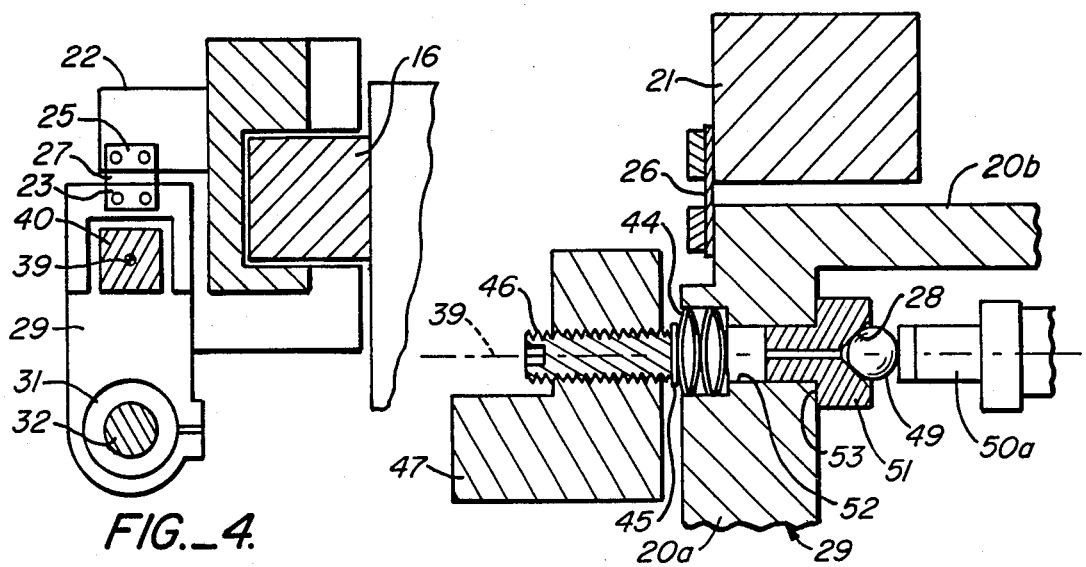
FIG._4.
FIG._5.
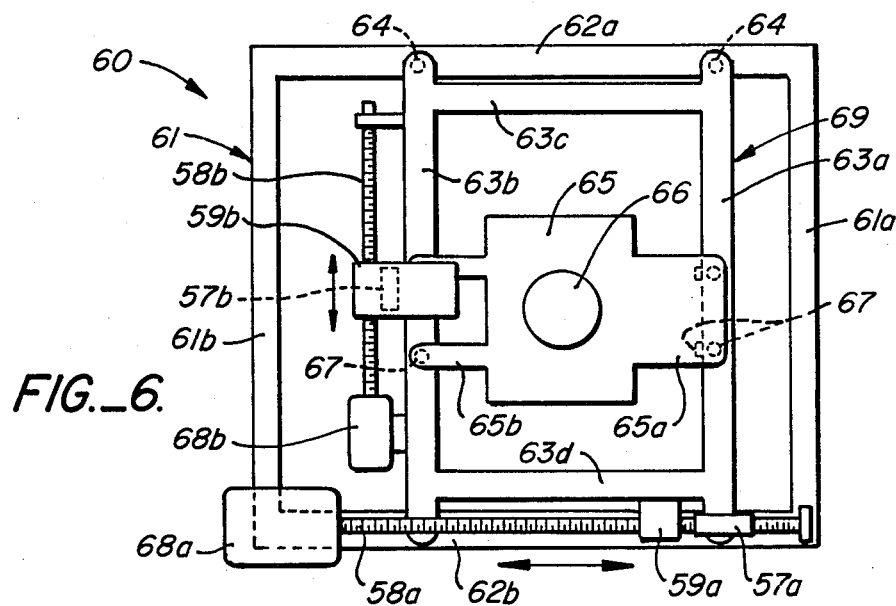
FIG._6.
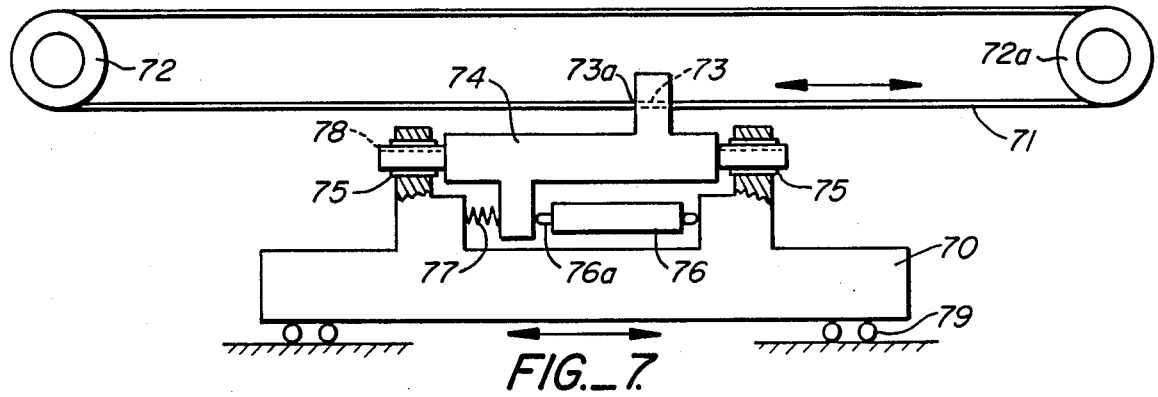
FIG._7.

COARSE AND FINE MOTION POSITIONING MECHANISM

RELATED APPLICATION

This application relates to U.S. application Ser. No. 884,251 filed July 10, 1986 entitled "Multisized Wafer Vacuum Pin Chuck", Inventor, Vladimir E. Leibovich, now abandoned, the disclosure of which is incorporated herein by reference.

FIELD OF THE INVENTION

The invention is directed to a precision positioning mechanism for precisely positioning a linearly moving part with respect to another part regardless of the distance of travel. More particularly, the invention is directed to a mechanism for providing coarse and fine adjustment of an adjustable stage mounting a semiconductor wafer for subsequent processing of the wafer in an x-ray lithography machine.

BACKGROUND OF THE INVENTION

In previous stage positioning mechanisms used in photolithography machines separate coarse and fine driving mechanisms have been employed. A coarse stage would first be driven in a coarse adjustment and, when the first stage was in its range of capture, a second fine stage mounted on the top of the first stage would be driven by a second separate mechanism in a fine adjustment to a desired position. Such position would be defined by its X and Y-axis coordinates as well as in rotation θ. The second stage slides or rolls on the first stage in the fine adjusting motion. Thus the typical existing mechanism is a "two story" one. U.S. Pat. Nos. 4,516,253 and 4,525,852 assigned to applicants' assignee show another wafer stage alignment device which includes both fine and coarse X and Y-axis adjustment using fine push-pull type piezoelectric motors and a coarse motor/lead screw arrangement. Additional piezoelectric motors are used for the Z-axis adjustment.

SUMMARY OF THE INVENTION

The present invention is a "single story" translating mechanism for each axis useful where very precise positioning of a moving part is required over a wide distance of travel. Particularly it is used for mounting and moving a stage, such as a pin chuck as seen in the related application. The stage supports a semiconductor wafer while the wafer is being processed in an x-ray lithography apparatus or other machine employed in the making of semiconductor chip devices, such as integrated circuits.

The mechanism is a dual stage device which utilizes the long distance advantages of a lead screw or other elongated drive means and the precision motion advantages of a piezoelectric transducer (PZT) device. It is used in combination with a low friction stage and "zero" backlash nut on the lead screw or other connection means to allow initial coarse motion of the stage and subsequent fine correction of the stage position. The primary advantages over conventional solutions to this problem is one of reduced complexity and subsequent cost. The conventional solution typically has been to provide separate fine and coarse stages and systems each with moving parts, guiding devices and bearings. The present invention is a precision positioning mechanism with a novel structural arrangement of the driving system which provides better stability and better repeatability of the chosen position; allows an increase of the velocity of the moving parts and thus can cut the positioning time due to the association between the coarse and fine driving devices; provides a decrease of the moving mass; and provides an increase of the rigidity of the whole mechanism.

The mechanism includes an in-line PZT construction with adjacent flexures or splined bushings which result in little or no torque or side loads on the operating members of the PZT. Compression loads only are provided during operation. The use of the piezoelectric devices on the X and Y-axis result in removal of any "slop" or backlash of the drive nut associated with the lead screw in the preferred embodiment. Operation of the lead screw and nut provides a coarse adjusting translating movement of the housing, stage and wafer. This is done through the PZT connection and involves bringing the stage into a capture range for fine adjustment. The housing, stage, and wafer combination is then precisionally displaced or translated by a fine adjustment of the piezoelectric motors to place the combination at desired precise X-axis and Y-axis coordinates. In a second embodiment an elongated cable or chain drive means is utilized and bushings with splines minimize torque transmission to the PZT.

BRIEF DESCRIPTION OF DRAWINGS

FIG. 1 is a schematic top view of a semiconductor wafer mounted on a wafer stage and the translating housing of the invention.

FIG. 2 is a schematic side view of the translating housing with a wafer stage and wafer mounted thereon.

FIG. 3 is a cutaway partial cross-sectional view of a preferred embodiment of the housing positioning mechanism for either X or Y-axis movement.

FIG. 4 is a cross-sectional view of the housing positioning mechanism taken on the line 4—4 of FIG. 3.

FIG. 5 is a detailed side view of the PZT operating end.

FIG. 6 is a detailed schematic top view of the X-axis and Y-axis positioning mechanisms of an operating embodiment.

FIG. 7 is a schematic side view of a second embodiment of the invention showing a cable device means for coarse adjustment of a wafer stage.

DETAILED DESCRIPTION

FIG. 1 shows a positioning housing 10 which mounts a stage 11 by suitable clamps or bolts (not shown). The housing and stage 11 is movable in X and Y-axis directions to a desired position by being driven initially by a pair of X and Y-axis motors 14 and 15 in the direction of the shown arrows. A semiconductor wafer 12 typically either 100 mm, 150 mm or 200 mm in diameter is mounted on a planar wafer supporting surface 9 of the wafer stage 11 and normally held thereon by a vacuum as described in U.S. Pat. No. 4,213,698 and in the related application. Movement of the housing wafer stage and wafer together is with respect to a wafer mask (not shown) placed above or otherwise parallel to the wafer typically as shown in U.S. Pat. No. 4,514,858. The mask is positioned so that x-rays from an x-ray source impinge the mask to delineate an appropriate masking pattern on the wafer during various steps employed in processing the wafer into the desired semiconductor device.

FIG. 2 broadly shows how a first part of the positioning mechanism (housing 10 and a stage 11) and a wafer 12 are moved translationally on a rail 16 together in an initial coarse adjustment along one axis. Only the X-axis is illustrated. As shown in detail in FIG. 3 an intermediate part in the form of a thrust member 29 has a lower transverse bore 30 on one leg 20a which receives and fixedly holds a zero backlash nut 31 and through which a lead screw 32 passes. A second leg 20b of member 29 at a right angle to leg 20a is connected to the housing 10 (FIG. 3) by suitable flat rectangular flexures. Upon revolution of the lead screw by motor 36, the nut 31 and thrust member 29 translate together on the lead screw and move housing 10 on air or roller bearings 38 with respect to fixed surface or base 38a in the directions indicated by the arrowheads. A separate Y-axis positioning mechanism is also employed as seen in FIGS. 1 and 6.

The disclosed preferred embodiment of the positioning mechanism seen in FIG. 3 employs a stage attached to a housing 10, the housing riding conventionally on air bearings 38 on a support base 38a and guided by an elongated rail 16 typically of square cross-section. In a preferred embodiment (FIG. 6) supporting air bearings are provided at three sides of the guide rails opposite ends 50 of the housing. The coarse drive systems for each of the X and Y-axis movements includes a DC electric motor 36 attached by mount 37 to a stationary base. A precision lead screw 32 is coupled to the motor 36 by a flexible coupling 36a and supported by the bearings 33 and 35 mounted on brackets 34 and 37, respectively. A preloaded self-adjusting nut 31 is fixedly mounted in the transverse bore 30 of the self-aligning multiflexured thrust member 29.

A fine drive system includes a piezoelectric transducer (PZT motor) 40 supported by two thrust balls 43 and 49 resting in two conical ball seats 28 on parts 42, 51 between support brackets 47 and 48. Member 29 is supported flexurally by two flexures 26, 27 attached to the housing 10 through blocks 21 and 22 by clamps 23 and 25. The flexures 26, 27 are made of spring material such as beryelium copper and have a thickness and width appropriate for the loads under consideration, about 0.010 inches thick and 0.5 inches wide in the preferred embodiment. PZT motor 40 is clamped between the balls 43 and 49 along a linear axis 39 in a transverse bore 52 (FIG. 5) of member 29 and preloaded by Belleville springs 44 and spacer 45. Typically eight springs are employed. The amount of preload is controlled by the screw 46, located in block 47 attached to the housing 10. The PZT support part 51 slidingly extends into a bore 52 in member 29 and into contact with springs 44.

In coarse alignment, the length of travel of the housing (and thus the stage) is determined by the length of the rail 16 and lead screw 32. When the motor 36 is energized, it drives the housing 10 a programmed distance as determined by a computer monitored rotary encoder mounted on the motor armature (not shown) as known in the art. The rotary motion of motor 36 and the lead screw 32 is translated into linear motion of the nut 31 which linearly drives member 29 which, in turn, drives the housing 10 through the balls 43 and 49, ball seats 28 and parts 42, 51, springs 44, spacer 45, screw 46, PZT motor 40, and PZT clamping assembly blocks 47 and 48.

Since the PZT motor and the attachment points of the device to the housing 10 are offset radially relative to the axis of the lead screw, a torque or couple could exist, which if not accounted for, could be applied to the lead screw nut or PZT motor resulting in binding of the lead screw nut or destroying the PZT motor, respectively.

The flexures 26, 27 allow motion of member 29 to be parallel to the lead screw and take up the torque due to this off axis arrangement. Because of this arrangement and because the PZT motor is clamped using the balls 43, 49 and parts 51 and 42 have self-centering cone-shaped seats, the load on the PZT motor is always axial regardless of the relative position between the member 29 and the PZT motor 40. This protects the PZT motor from any side load to which it is very sensitive.

After a predetermined coarse position of the housing 10 is reached (which means that the desired position of the stage 11 is within the range of the PZT motor pusher per se travel) the DC motor 36 is de-energized and a voltage applied to the PZT motor 40. The motor acts to expand and move a PZT pusher rod 50a at one end and thus, exerts a force on ball 49 and part 51 to move the housing. The shoulder 53 of part 51 abuts member 29 around bore 52 to move member 29. Ball 43, adjusting screw 41, and block 48 at the same time axially support the PZT at the other end of the PZT. If an opposite motion is desired, the pusher 50a is moved back inwardly into the PZT by changing the PZT voltage and the Belleville springs 44 expand to keep axial contact between the pusher 50a, ball 49, and part 51. The above motion of the housing 10 and stage 11 will then be as accurate as the resolution of the PZT motor and the sensor that is sensing the desired position. The achieved accuracy is 0.05 micrometers or better for a low friction stage using a high stiffness PZT. The current embodiment uses a PZT with a stiffness factor of 10 newtons/micron.

FIG. 4 shows the housing slidable on rail 16 and the offset positions of the lead screw 32 and nut 31, flexure 27 and the PZT motor 40 and member 29.

FIG. 5 is a detail of the pusher end of the PZT showing the interaction of the preload screw, spring spacer 45, Belleville springs 44, the PZT support part 51, ball seat 28, ball 49 and the pusher 50a.

While the invention has been described in detail with respect to one axis, it is to be understood that two positioning mechanisms one for the X-axis movement and the other for the Y-axis movement are employed such as broadly illustrated in FIG. 1. FIG. 6 shows an operating embodiment of a coarse and fine two-axis positioning system 60 of the invention. A structural base frame 61 comprises base legs 61a, 61b interconnected with side rails 62a, 62b to form a rectangular frame. A stage mounting frame 69 includes rails 63a, 63b extending transverse to rails 62a, 62b and supported and slidable on top and side surfaces thereof by a series of air bearings 64. Cross-pieces 63c, 63d give structural rigidity to the stage frame. A stage 65 which normally mounts a semiconductor wafer support pin chuck 66 is provided which has fixed legs 65a, 65b extending from an edge of the stage slidingly supported by air bearings 67 on the top and a side of rails 63a, 63b. Frame 69 is movable on one axis by coarse movement of motor 68a, lead screw 58a, intermediate member 59a and PZT 57a. Likewise stage 65 is movable on an axis orthogonal to frame 69 by operation of motor 68b, lead screw 58b, intermediate member 59b and PZT 57b, both as set forth in detail in FIG. 3. The overall mechanism may also include a Z-axis (tilting) adjustment as seen, for example, in U.S. Pat. No. 4,525,852.

Shown in FIG. 7 is an alternate embodiment to further illustrate the nature of the invention. A stage 70 movably mounted on roller or air bearing 79 is driven by an endless cable 71 or chain which is moved around pulley by a motor driven pulley 72a. The cable is only coarsely positioned and is not rigid in the transverse direction or under an applied movement at a connection link 73. An intermediate thrust member 74 is attached to the cable at the position of connector 73 and mounted to the stage via two splined bushings 75 or by flexures. These bushing or flexure members absorb the torsion moment created by the off axis condition of the attachment point 73a and the center of mass of the driven stage 70 or the frictional forces (if any). The splines 78 of the bushings (or flexures if employed) also guide member 74 so it is constrained to move approximately parallel along the axis of motion of the stage 70. A fine positioning device such as a PZT motor 76 is used to define the position of the intermediate thrust member 74 relative to the stage 70. A constant load is applied to the PZT motor 76 by a load spring 77 in order that the force on the PZT motor is always one of compression, rather than extension. By varying the length of the PZT pusher 76a, a fine stage motion can be achieved even though the cable drive is only coarsely positioned.

In the preferred embodiment pusher-type piezoelectric motors, such as Model P-173 sold by Physik Instrumente, (Scientific Spectrum) San Jose, CA, are utilized. Belleville springs of Type No. B0375-015-5 from Barnes Co. having an outer diameter of 0.375 in are typically used. Coarse accuracies of the lead screw of from 10 to 3 microns are realized while the PZT pushers are movable in 0.01 micron steps and are thus capable of positioning the housing, stage and wafer within 0.01 microns of its intended position in both X and Y-axis directions.

The invention also contemplates that in one embodiment the course adjusting motor is de-energized stopping rotation of the lead screw and coarse movement of the intermediate part with respect to the first part or stage. At this point the PZT is utilized to finely adjust the intermediate part to place the first part in the desired accurate position sought. In another embodiment (not shown) the fine adjustment can be used during coarse movement to finely and constantly correct a coarse movement by a closed loop signal control, for example, to correct an overall motion into a desired accurate pathway.

The above description of the preferred embodiment of this invention is intended to be illustrative and not limiting. Other embodiments of this invention will be obvious to those skilled in the art in view of the above disclosure.

We claim:

1. A coarse and fine positioning mechanism for movement of a first part with respect to a base comprising:
    a first part to be translated along a first linear axis;
    drive means extending along a second linear axis parallel to said first linear axis for driving said first part;
    motor means connected to said drive means for moving said drive means;
    an intermediate part including a connecting means fixed to said intermediate part and translatably movable with said drive means;
    flexure means for mounting and linearly guiding said intermediate part to said first part, said flexure means comprising a single pair of spaced flat flexures extending between and connecting said first part and spaced portions of said intermediate part, wherein movement of said intermediate part by movement of said drive means coarsely adjusts said first part to a desired position on said first linear axis and wherein said flexure means for mounting and guiding absorbs moments resulting from inertial and frictional forces resultant from translational movement of said first part along said first axis and movement of said drive means along said second axis;
    a linear piezoelectric motor extending on an axis parallel to and displaced from said drive means, said piezoelectric motor having a first end in operable connection to said first part and a second end in operable connection to said intermediate part; and
    wherein expansion and contraction of said piezoelectric motor causes a motion of said intermediate part for finely adjusting the linear position of said intermediate part and the first part through motion transferred through said flexure means for mounting and linearly guiding.

2. The positioning mechanism of claim 1 in which said drive means comprises a lead screw, said connecting means comprises a nut fixed to said intermediate part; and said means for moving and said means for guiding said intermediate part comprises flexure means.

3. The positioning mechanism of claim 2 in which said intermediate part comprises a right angular member having a first leg mounted at its ends by said spaced flat flexures to said first part, and a second leg at a right angle to said first leg, said second leg including a first transverse bore fixedly mounting said nut and wherein said lead screw passes through said bore and is in threaded engagement with said nut.

4. The positioning mechanism of claim 3 in which said second leg includes a second transverse bore and further comprising axial means extending in said second bore for axially connecting said second end of said piezoelectric motor to said intermediate part.

5. The positioning mechanism of claim 2 wherein said flexure means comprises two flexures connected at opposite ends of said second leg and spaced positions of said first part.

6. The positioning mechanism of claim 1 wherein said first part comprises a semiconductor wafer-supporting stage having a planar wafer-supporting surface.

7. The positioning mechanism of claim 1 wherein said coarse and fine positioning mechanism operates on an X-axis to move said first part in an X-axis direction and wherein a second coarse and fine positioning mechanism is attached to said first part to move said first part in a Y-axis direction.

8. The positioning mechanism of claim 7 including a support base and air bearings moveably supporting said first part on said base and wherein said first part comprises a semiconductor wafer-supporting stage movable on said air bearings to coarse and fine positions along said X and Y-axis to accurately position a mounted wafer in a desired X and Y-axis coordinates position.

9. In combination, a semiconductor wafer-mounting stage and a positioning mechanism comprising:
    a wafer-mounting stage having a planar surface for mounting a wafer;
    a first thrust member;
    first flexure means including spaced flat flexures for connecting said first thrust member and said stage;

a first rotatable lead screw and a first fixed nut threadedly supported by said lead screw and said first thrust member along an axis parallel to said stage planar surface;

a first piezoelectric motor extending on an axis parallel to and displaced from the axis of said first lead screw and contacting said first thrust member and said stage;

wherein rotation of said first lead screw moves said first nut and said first thrust member and translates said stage to coarsely adjust the stage position; and wherein said first piezoelectric motor includes a first linear-acting pusher for exerting a force on said first thrust member to move said first thrust member and to translate said stage to finely adjust the stage position, said flexure means being mounted to absorb movements resulting from inertial and frictional forces resultant from movement of said lead screw and said pusher.

10. The combination of claim 9 in which said first thurst member operates to translate said stage in a first X-axis direction and further comprising a second thrust member connected to said stage, a second flexure means, second rotatable lead screw, second fixed nut means and a second piezoelectric motor, all connected as in claim 9, to translate said stage in a second Y-axis direction.

* * * * *